Figure 1:
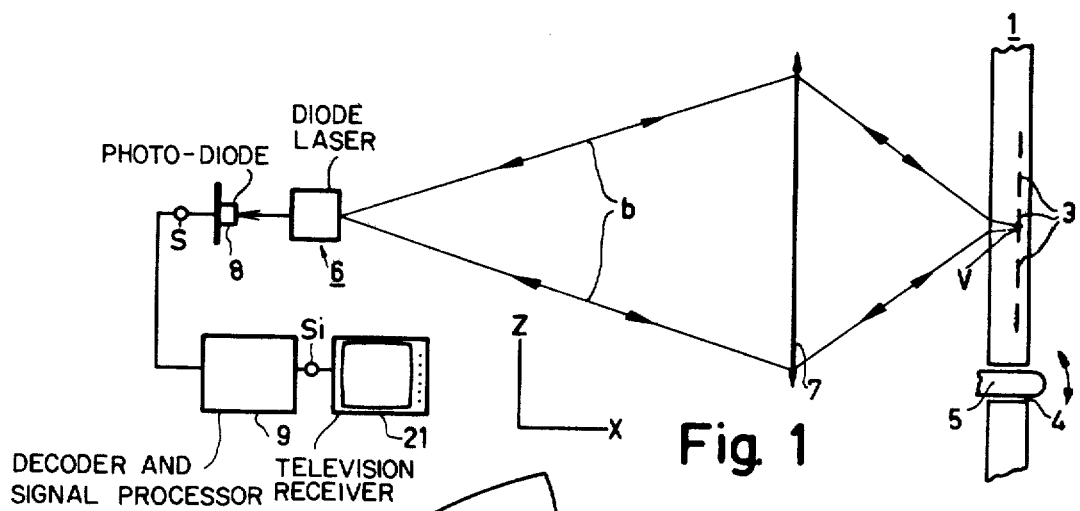

United States Patent [19]

Heemskerk et al.

[11] 4,365,323
[45] Dec. 21, 1982

[54] OPTIC READ UNIT FOR SCANNING A RECORD CARRIER HAVING A RADIATION-REFLECTING INFORMATION STRUCTURE

[75] Inventors: Jacobus P. J. Heemskerk; Kornelis A. Immink; Carel A. J. Simons, all of Eindhoven, Netherlands

[73] Assignee: U.S. Philips Corporation, New York, N.Y.

[21] Appl. No.: 130,906

[22] Filed: Mar. 17, 1980

Related U.S. Application Data

[63] Continuation of Ser. No. 924,858, Jul. 17, 1978, which is a continuation of Ser. No. 735,120, Oct. 22, 1976, abandoned.

[30] Foreign Application Priority Data

Aug. 2, 1976 [NL] Netherlands .................. 7608561

[51] Int. Cl.³ ............................................ G11B 7/00
[52] U.S. Cl. ............................................ 369/44; 369/45; 369/112; 369/120; 369/122; 350/432; 250/201; 250/202
[58] Field of Search .................. 369/45, 44, 43, 122, 369/120, 111, 112; 250/201, 202, 552, 570; 357/17, 18, 19; 365/106, 120, 234; 358/128.5; 350/432, 474, 478; 360/77

[56] References Cited

U.S. PATENT DOCUMENTS

| | | | |
|---|---|---|---|
| 3,436,679 | 4/1969 | Fenner | 369/97 |
| 3,673,412 | 6/1972 | Olson | 369/44 |
| 3,812,477 | 5/1974 | Wieder | 369/122 |
| 3,876,827 | 4/1975 | Janssen | 369/44 |
| 3,876,841 | 4/1975 | Kramer | 369/45 |
| 3,876,842 | 4/1975 | Bouwhuis | 369/44 |
| 3,931,460 | 1/1976 | Watson | 369/44 |
| 3,932,700 | 1/1976 | Snopko | 369/45 |
| 3,941,945 | 3/1976 | Borner | 369/122 |
| 3,952,191 | 4/1976 | Tinet | 369/45 |
| 3,992,574 | 11/1976 | Bouwhuis | 369/45 |
| 3,999,008 | 12/1976 | Bouwhuis | 369/45 |
| 4,005,259 | 1/1977 | Konebo | 369/122 |
| 4,027,952 | 6/1977 | Hogues | 369/112 |
| 4,190,775 | 2/1980 | Sakurai | 369/45 |

FOREIGN PATENT DOCUMENTS

1097023  12/1967  United Kingdom ............... 369/122

OTHER PUBLICATIONS

*University Physics*, by Sears et al., ©1962, Addison—Wesley Publishing Co., Inc., p. 843.

Primary Examiner—Alan Faber
Attorney, Agent, or Firm—Thomas A. Briody; Robert T. Mayer; Algy Tamoshunas

[57] ABSTRACT

An optical read unit is described for scanning a record carrier with a radiation-reflecting trackwise-arranged information structure. The read unit utilizes a diode laser which generates the read beam and also detects the information stored on the record carrier. The read unit is also provided with an opto-electronic system for detecting the position of the read spot relative to a track to be read and the position of the plane of focussing. The diode is mounted in a housing and the unit includes electromechanical apparatus for moving the housing in two perpendicular directions so as to correct the position of the read spot. The objective system for the formation of the read spot is of simple construction.

22 Claims, 16 Drawing Figures

OPTIC READ UNIT FOR SCANNING A RECORD CARRIER HAVING A RADIATION-REFLECTING INFORMATION STRUCTURE

This is a continuation of application Ser. No. 924,858, filed July 17, 1978, which was a continuation of Ser. No. 735,120, filed Oct. 22, 1976, now abandoned.

The invention relates to an optical read unit for scanning a record carrier with a radiation-reflecting track-wise arranged information structure during the movement of the record carrier and said read unit relative to each other, which read unit comprises an objective system for focussing a read beam on the information structure and a radiation-source/detection-unit, which last-mentioned unit comprises a semiconductor-diode laser which supplies the read beam and which also receives the read beam which has been reflected by the information structure, specific properties of the diode laser varying in dependence upon the read-out information.

Optical read unit is to be understood to mean the combination of means which assure that a read beam is produced, that said beam is focussed onto the information structure to a read spot of the desired dimensions, and that the reflected read beam is converted into an electrical signal.

A "track-wise arranged" information structure is to be understood to mean a structure whose information details are arranged in accordance with concentric or quasi-concentric tracks, which last-mentioned tracks together constitute a continuous spiral track.

The "specific properties" of the diode laser which vary are the quotient of the voltage across and the current through the diode laser at a specific current, referred to as the electric resistance of the diode laser, and the radiation intensity which is emitted by the diode laser at a specific current.

Information, such as a color television program, can be stored in a record carrier in a track-wise information structure, the tracks comprising a multitude of areas alternating with intermediate areas. The information may be coded in the spatial frequency of the areas and the length of the areas. The areas may optically differ from the intermediate areas in that they, for example, have a different absorption coefficient or a different phase depth.

In this respect it is advantageous if the information structure is a reflecting structure, i.e. if the areas are radiation-absorbing and the intermediate areas are radiation-reflecting, or if the areas and the intermediate areas are both reflecting but are situated at different depths in the record carrier. In that case the unmodulated read beam which is emitted by the radiation source and the modulated read beam which is reflected by the information structure substantially traverse the same optical path, so that vibrations of the optical elements which are included in the common radiation path relative to each other have substantially no effect on the read-out signal.

When a radiation reflecting record carrier is read with the aid of a gas laser, such as a helium-neon laser, the modulated read beam should be directed towards a radiation-sensitive detector which is situated outside the common radiation path. For this purpose it is for example possible to include a semi-transparent mirror in the common radiation path. However, in that case, for example, only 25% of the radiation emitted by the source is utilized for read out, apart from absorption and reflection losses in the optical path. Furthermore, when a gas laser is used care must be taken that the modulated radiation cannot be fed back to the laser, because then, owing to the great coherence length of the laser beam, undesired fluctuations in the read beam may arise. For this purpose, additional steps must be taken. For example, the semitransparent mirror must be replaced by a more expensive polarization-sensitive dividing prism and between this prism and the record carrier a λ/4 plate must be included.

In the published German Patent Application ("Auslegeschrift") No. 2,244,119, corresponding to U.S. Pat. No. 3,941,945, it is proposed to read out a record carrier with the aid of a semiconductor diode laser. Use is then made of the fact that when the radiation beam which is emitted by the diode laser is reflected to the diode laser by the record carrier, the intensity of the emitted laser beam and the electrical resistance of the diode laser increase. When a track of a record carrier is scanned with such a laser beam the said intensity and electrical resistance will vary in accordance with the sequence of areas and intermediate areas in the relevant track. The record carrier can then be read without making use of a separate detector. A beam splitter is then no longer necessary and the read apparatus may be of simple construction.

In order to enable very small information details, for example of the order of 1 μm to be read, the read beam should always remain sharply focussed at the information structure. Furthermore, care must be taken that the center of the read spot always coincides with the center of a track to be read. In the apparatus in accordance with German Patent Application No. 2,244,119 the diode laser is for this purpose mounted on a skate which is pulled through grooves which are pressed in the record carrier. Such a mechanical guidance has the drawback that the record carrier is subject to wear. Moreover, the arrangement in accordance with the German Patent Application does not allow the diameter of the read spot to be made small enough, so that the resolution is not high enough for reading information details of the order of μm's.

It is the object of the present invention to provide an apparatus of the type mentioned in the preamble which does not have the last-mentioned drawbacks, which enables a particularly accurate read-out and which is of simple construction. The apparatus in accordance with the invention is characterized in that the radiation-source/detection-unit comprises optoelectronic means for detecting a deviation in the position of the read spot relative to a track to be read and/or a deviation between the desired and the actual position of the plane of focussing of the objective system.

Signals which are an indication of the said deviations and which are supplied by the radiation-source/detection-unit are processed to control signals for correcting the position of the read spot relative to the track to be read, or the plane of focussing of the objective system respectively, in a manner known per se.

During reading of the record carrier the read head does not come into contact with the information structure. This structure may then be located underneath a transparent protective layer, so that read-out is not affected by dust particles, fingerprints and scratches.

For a read apparatus in which a gas laser is used as a radiation source, the applicant has already proposed a number of methods of detecting positional errors of the read spot relative to a track to be read (for example in U.S. Pat. No. 3,876,842, issued Apr. 8, 1975) and for detecting deviations between the desired and the actual position of the plane of focussing (for example in U.S. Pat. No. 3,876,841, issued Apr. 8, 1975). It appears that the control signals derived in accordance with these methods can be influenced by variations in the direction and intensity of the read beam which may arise as a result of feedback of the modulated read beam to the radiation source. The frequencies of these optical variations approximate the frequencies of the desired control signals. In order to obtain suitable control signals additional steps must be taken so as to prevent feedback. In the apparatus in accordance with the present invention use is made of the radiation which is fed back to the diode laser both for the information read-out and for deriving control signals. The above-mentioned problem of optical variations then does not arise.

For detecting a positional error of the read spot relative to a track to be read an apparatus in accordance with the invention may be characterized in that the radiation source/detection unit comprises means for converting a periodic electrical signal into a periodic movement of the read spot transversely to the track direction, with an amplitude smaller than the diameter of the read beam and with a frequency substantially smaller than the frequency which corresponds to the average spatial frequency of the details in the information structure, and that in an electronic circuit for processing the signal supplied by the diode laser a filter is included for extracting a low-frequency signal which is processed to a control signal, which control signal is applied to electromechanical means for correcting the position of the read spot, averaged in time, relative to a track to be read.

It is to be noted that from the previous Netherlands Patent Application No. 66.01666 (I.B.M), which has been laid open for public inspection, it is known per se to move a radiation beam produced by a diode laser. However, in that case the laser beam is not fed back to the diode laser, so that the diode laser is not used as a detector. The movement of the laser beam is not used for detecting positional errors of the read beam during read out of a record carrier. The previous Netherlands Patent Application does not give any details in respect of the amplitude and frequency of the beam movement.

For detecting a deviation between the actual and the desired position of the plane of focussing of the objective system an apparatus in accordance with the invention may furthermore be characterized in that electromechanical drive means are provided for periodically moving the radiation-source/detection-unit in the direction of the optical axis of the objective system, the frequency of the movement being substantially smaller than the frequency which corresponds to the average spatial frequency of the details in the information structure and the amplitude of the movement being smaller than the depth of focus of the objective system, and that in an electronic circuit for processing the signal supplied by the diode laser a filter is included for deriving a low-frequency signal which is processed to a control signal, which control signal is applied to electromechanical means for correcting the position, averaged in time, of the radiation-source/detection-unit, along the optical axis.

It is to be noted that it is known per se from U.S. Pat. No. 3,673,412, to oscillate a read spot along the optical axis during read-out of an optical record carrier. However, in that case an additional oscillating mirror is used which is disposed in the light path. Furthermore, no radiation-source/detection-unit is employed, but a separate radiation source and a separate detector. Moreover, the record carrier is read in transmission and not in reflection.

An apparatus in accordance with the invention in which the radiation beam which is emitted by the diode laser is periodically moved and the position of the radiation-source/detection-unit along the optical axis is periodically varied, may furthermore be characterized in that the time functions which represents the variations are given by: $p(f \cdot t)$ and $p(nf \cdot t + \pi/2)$, where p represents a periodic function and f the frequency with which one of the variations takes place, and in which $n = 1, 2$ etc.

A further embodiment of an apparatus in accordance with the invention is characterized in that the radiation-source/detection-unit, in addition to a main diode laser which supplies the read beam, comprises two auxiliary diode lasers which supply auxiliary beams of mutually equal intensity, each auxiliary diode laser receiving its own auxiliary beam after reflection at the information structure.

With the auxiliary diode lasers two auxiliary spots are formed, of which one spot may be disposed in front of the plane of the read spot and the other behind said plane, the positions of the two auxiliary spots in the lateral direction of a track being the same. The difference of the low-frequency components in the signals supplied by the auxiliary diode lasers then provides an indication of the focussing of the objective system. It is also possible that the auxiliary spots are situated in the same plane as the read spot. If the auxiliary spots are symmetrically shifted relative to the read spot in the lateral direction of a track, the difference of the low-frequency components in the signals supplied by the auxiliary diode lasers provides an indication of the position of the center of the read spot relative to the center of the track to be read.

It is to be noted that it has been proposed previously by the Applicant to employ two auxiliary radiation spots for detecting a deviation in the position of a read spot relative to a track to be read (in U.S. Pat. No. 3,876,842, issued Apr. 8, 1975), and for detecting focussing errors (in U.S. Pat. No. 3,992,574, issued Nov. 16, 1976). In these arrangements either separate radiation sources or elements for splitting the radiation beam supplied by the gas laser into subbeams must be provided. The subbeams must be reflected to separate detectors after reflection at the record carrier. Moreover, the derived control signals are susceptible to the previously mentioned optical noise. An advantage of the diode laser is that a multiplicity of such lasers can be integrated onto a semiconductor substrate, so that the composite laser can be very small. Then the control signals cannot be influenced by vibrations of the radiation sources relative to each other.

If for detecting either a positional error of the read spot relative to a track to be read or a focussing error, use is made of the above-mentioned possibilities, the optical read unit may be of very simple design. In accordance with a further characteristic feature this optical read unit comprises a hollow cylindrical body in which the radiation-source/detection-unit and the objective system are disposed, and said body is externally provided with electro-mechanical means for correcting the position of this body in its longitudinal direction and/or in at least one of two mutually perpendicular directions which are perpendicular to the longitudinal direction, the control signals supplied by the opto-electronic means being applied to the electromechanical means.

An objective system for an optical read unit in accordance with the invention should comply with stringent requirements. The numerical aperture of the system must be large and the system must be satisfactorily corrected. In order to meet these requirements a read unit in accordance with the invention is further characterized in that the objective system is a hemi-symmetrical system and consists of a first and a second simple lens with aspherical surfaces. Hemi-symmetrical is to be understood to mean that the parameters, such as the radii of curvature of the lens surfaces or the degree of being aspheric of said surfaces, of the one lens differ by a factor which is equal to the magnification factor of the lens system from the parameters of the other lens. Such a lens system is very advantageous in view of manufacturing technology.

If the size of the radiating surface of a diode laser is not larger than the desired size of the read spot, the lenses may even be identical, so that manufacturing the lens system is even further simplified.

Figure 2:
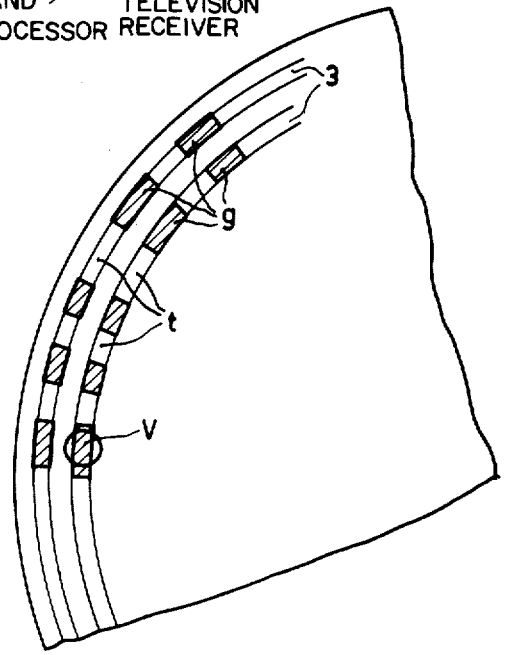
Figure 3:
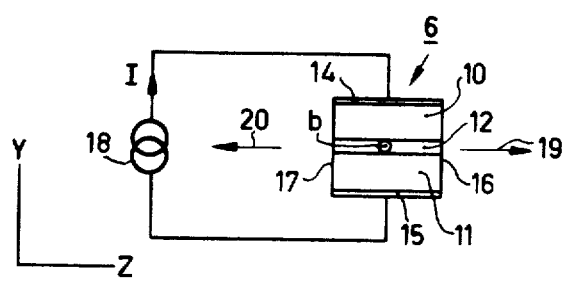
Figure 4:
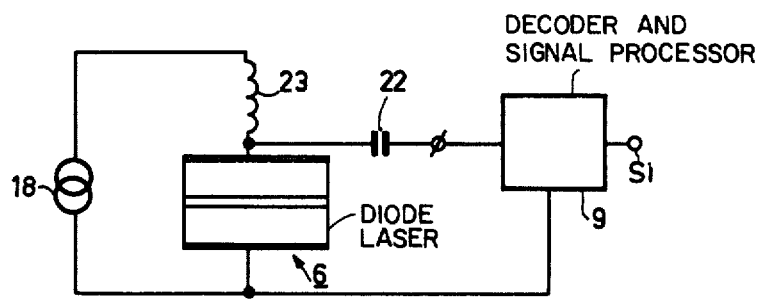
Figure 5:
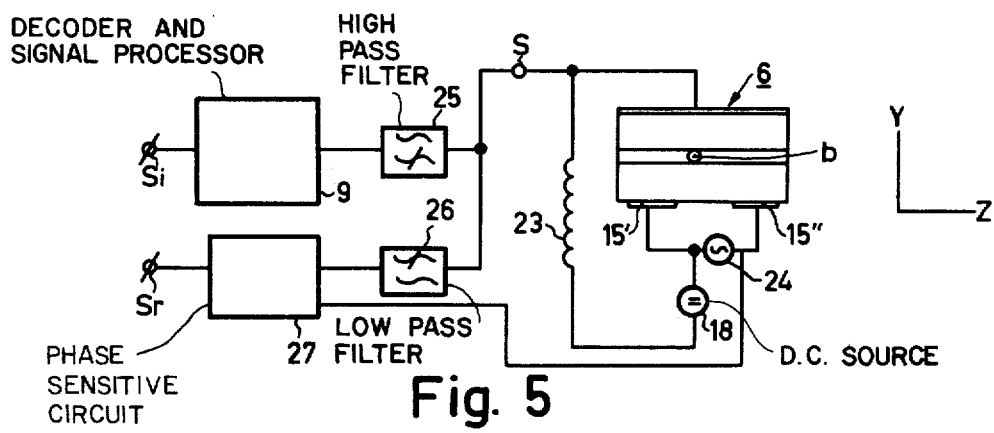
Figure 6:
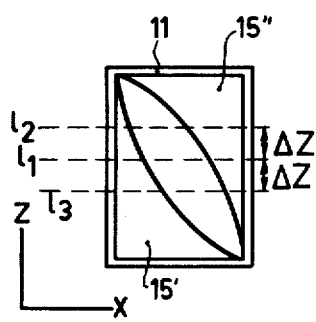
Figure 7:
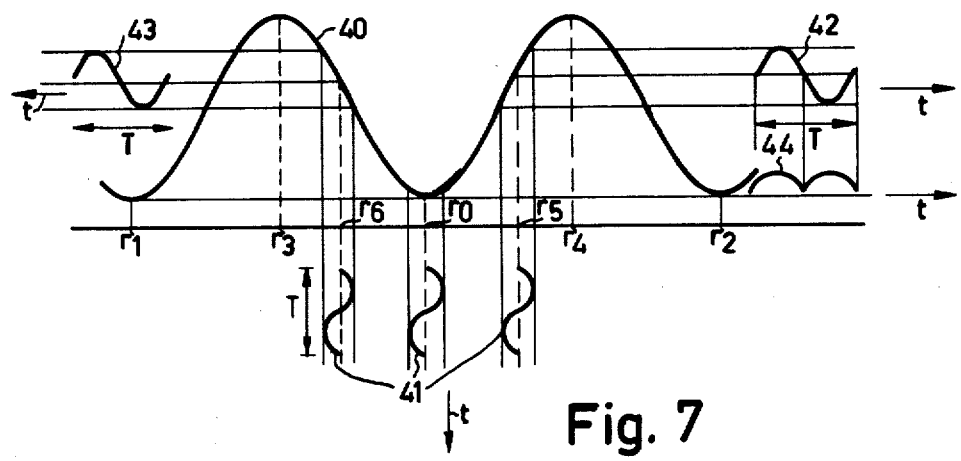
Figure 8:
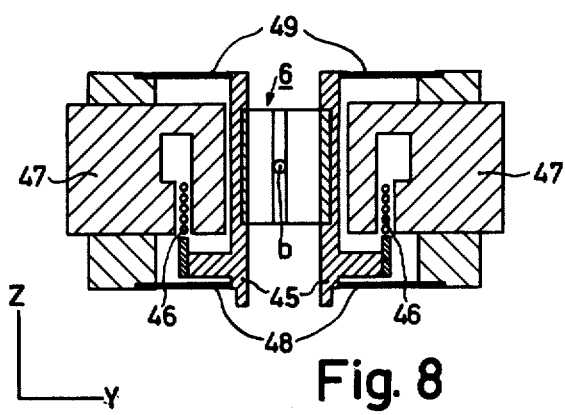
Figure 9:
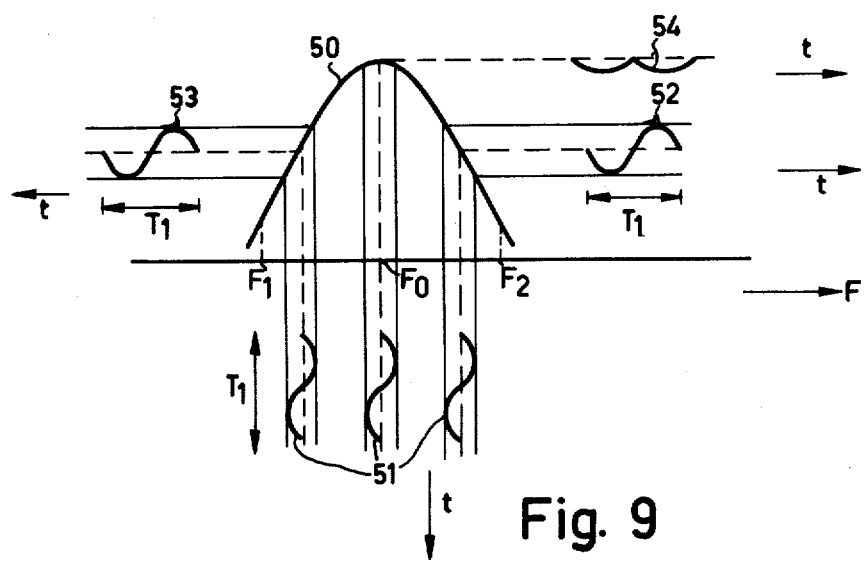
Figure 10:
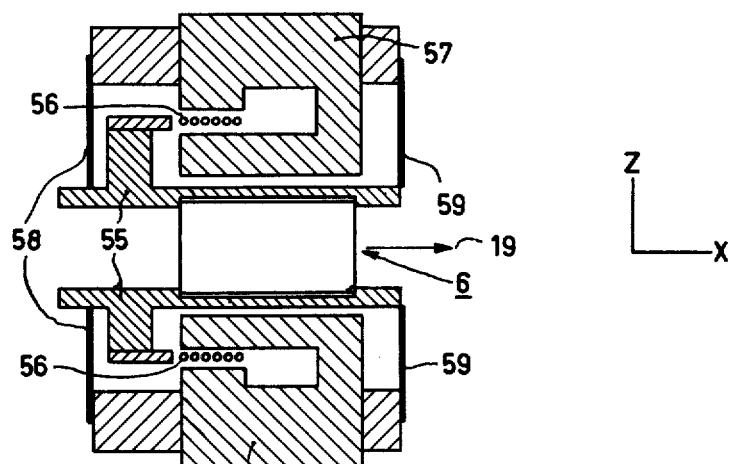
Figure 11:
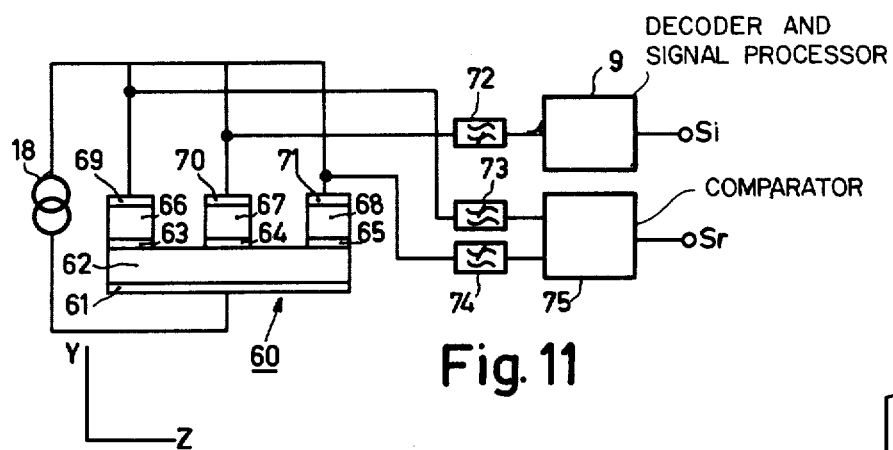
Figure 12:
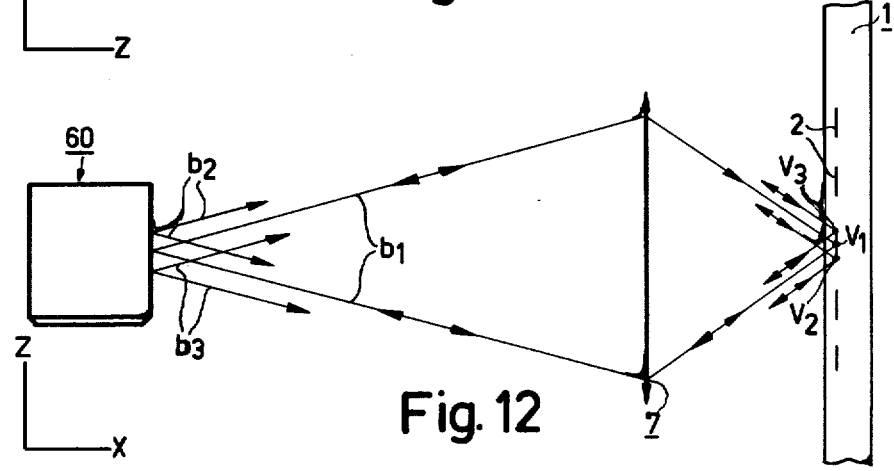
Figure 13:
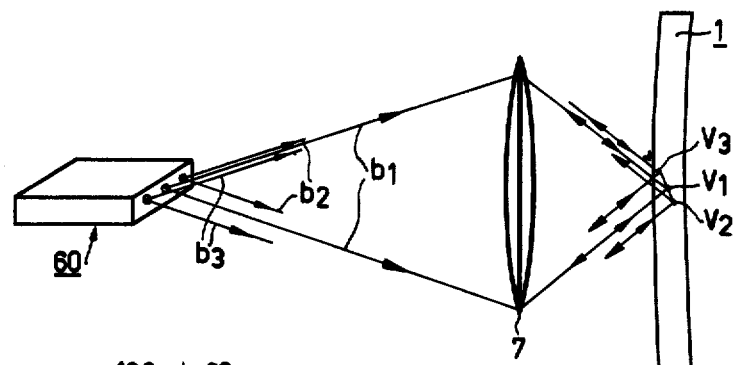
Figure 14:
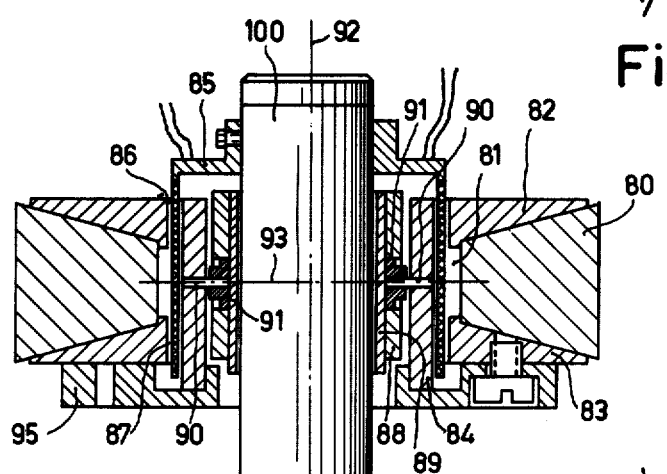
Figure 15:
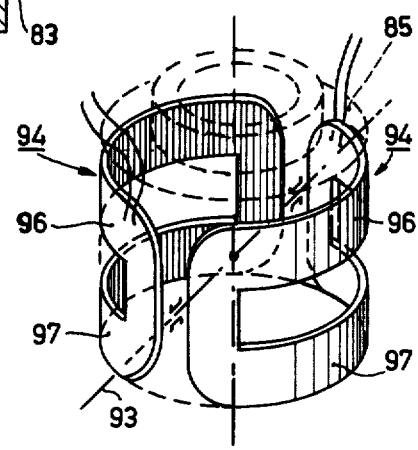
Figure 16:
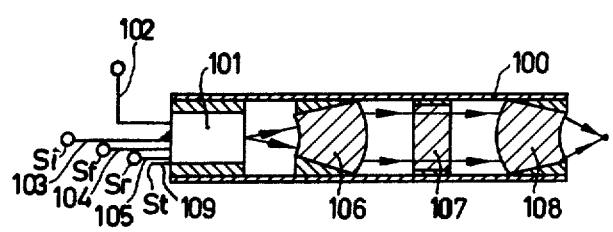

The invention will now be described with reference to the drawing in which:

FIG. 1 shows a known read apparatus employing a diode laser as radiation source, FIG. 2 shows a known form of a record carrier, FIG. 3 shows a known form of a diode laser, FIG. 4 shows how the variation in the diode laser can be measured, FIG. 5 schematically shows a part of an embodiment of an apparatus in accordance wit the invention, FIG. 6 shows an electrode of the diode laser employed in this apparatus, FIG. 7 represents the principle utilized in the apparatus of FIG. 5, FIG. 8 shows an embodiment of the means for correcting the position of the diode laser in a direction transverse to the track direction, FIG. 9 represents the principle employed in a second embodiment of an apparatus in accordance with the invention, FIG. 10 shows an embodiment of the means for moving the diode laser in an axial direction, FIG. 11 shows a composite diode laser and, schematically, the associated signal processing circuit, FIG. 12 shows a read apparatus in which the composite diode laser of FIG. 11 is utilized, FIG. 13 shows a fourth embodiment of an apparatus in accordance with the invention, FIGS. 14 and 15 show a device for moving an optical read unit in the axial and the transverse direction and FIG. 16 is a cross-section of an optical read-unit in accordance with the invention.

By means of the co-ordinate system XYZ it is indicated which views of the read unit or the separate elements are shown in the Figures.

FIG. 1 is a radial cross-section of a record carrier, which by way of example is assumed to be disk-shaped and round.

FIG. 2 shows a bottom view of this record carrier. The information may be contained in a spiral track, which comprises a multitude of quasi-concentric subtracks 3 each extending along one revolution of the record carrier. Each subtrack comprises a multitude of areas g which alternate with intermediate areas t, while the information may be contained in the lengths of the areas and the intermediate areas. The areas have a different effect on a read beam than the intermediate areas. The manner in which the information may be recorded in the tracks is irrelevant for the present invention and is therefore not discussed. The plane 2 of the tracks may be located at the front of the record carrier. However it is alternatively possible as is shown in FIG. 1, that the information structure is located at the back of the record carrier, so that the record carrier itself is employed as a protective layer. The type of information stored is not of importance for the present invention, and may be a color television program or other information.

The record carrier is read by a radiation beam b from a semiconductor diode laser 6. By means of an objective system, which for simplicity is represented by a single lens 7, the beam b is focussed to a read spot V on the information structure. The radiation beam which is reflected by the information structure traverses the objective system for a second time and enters the diode laser. The objective system may be selected so that the read spot is larger than the width of a track. Apart from the optical losses in the read apparatus, the beam, if this read beam is incident on an area, will be deflected partly beyond the aperture of the objective system, so that the intensity of the radiation which returns to the diode laser substantially decreases. If the read spot falls outside the area on the information structure, the read beam will for the greater part return to the diode laser. When the record carrier 1 is rotated around a spindle 5 which extends through the central opening 4, the reflected read beam is intensity-modulated in accordance with the sequence of areas and intermediate areas in a track to be read. The reflected read beam influences certain properties of the diode laser.

FIG. 3 shows such a diode laser. The laser consists of two layers 10 and 11 of for example the mixed crystal AlGaAs, the layer 10 being of the p-conductivity type and the layer 11 of the n-conductivity type. The intermediate layer 12 for example consists of pure GaAs. Disposed on the layers 10 and 11 are electrodes 14 and 15. The current I supplied by the current source 18 passes through the layers 10, 12 and 11. At the interface of the layers 10 and 12 electrons are injected into the intermediate layer 12. In this intermediate layer recombination of electrons and holes takes place under emission of radiation with a wavelength of approximately 900 nm. The end faces 16 and 17 have a suitable reflection coefficient. The radiation is repeatedly reflected by these surfaces. The amplified radiation, or laser radiation, emerges at the surfaces 16 and 17, as indicated by the arrows 19 and 20.

As previously stated, the radiation which is reflected by the record carrier returns to the diode laser. Under certain conditions the radiation which is fed back will stimulate a further emission of radiation, so that the intensity of the radiation which is instantaneously emitted in the directions 19 and 20 is determined by the information on the record carrier. In a realized embodiment of an apparatus in accordance with the invention it was found that if the current I through the diode laser was for example slightly greater than a threshold value, the intensity of the emitted laser beam, if the laser beam was incident outside an area on the record carrier, was approximately 2 times greater than in the case that the laser beam was incident on the area. An essential requirement for feedback read-out is that the distance between the information structure and the diode laser is greater than a specific minimum value. Only in that case the optical feedback will result in a variation of the radiation emitted by the diode laser.

For converting the intensity variations in the laser beam, as shown in FIG. 1, a radiation-sensitive detector 8, such as a photo-diode, may be disposed at the side of the diode layer which is remote from the record carrier. The signal S can be processed and decoded to an information signal $S_i$ in a known electronic circuit, as for example that described in Philips Technical Review 33, No. 7, pages 181–185. This signal, if a TV-program is stored on the record carrier, may be reproduced with the aid of a conventional television receiver 21.

In FIG. 1 the photodiode is represented as a separate element. However, the photodiode may be integrated with the diode laser to form a unitary assembly. Furthermore, it is not necessary that the radiation emerges from the back of the diode laser, i.e. in the direction 20 of FIG. 3. The diode laser may be adapted so that the radiation emerges also in a direction which is transverse or obliquely relative to the direction 19. In that case a photo-diode 8 must be arranged beside the diode laser instead of behind this laser.

FIG. 4 by way of example shows how the record carrier can be read without the use of a radiation-sensitive element. The variation of the voltage across the diode laser is then measured at a constant current I. In a realized embodiment of an apparatus in accordance with the invention the difference in the diode voltages appearing that the laser beam was incident outside an area on the information structure and when the laser beam was incident on an area was approximately 0.1 V. This voltage may be applied to the electronic circuit 9 via a coupling capacitor 22. The coil 23 in series with the current source presents a high impedance to the read-out signal.

When the record carrier is read out care must be taken that the read spot is always correctly aligned relative to a track to be read. Therefore, means must be provided for detecting a positional error of the read spot relative to the track to be read. In accordance with the invention a positional error can be dynamically detected if the read spot is moved periodically and transversely to the track direction. The amplitude of the periodic movement should then be smaller than the track width, so that the read beam always "views" a sufficiently large part of the track.

To obtain the movement of the read spot use can be made of a principle which is described in the previous Netherlands Patent Application No. 66.01666, which has been laid open for public inspection, and in U.S. Pat. No. 3,436,679. In accordance with this principle one of the electrodes is divided into two or more subelectrodes and appropriate currents are applied to these subelectrodes. Since for a diode laser the laser action can be obtained only if the sum of the products for each subelectrode, the current through a subelectrode and the length of the subelectrode, reaches a specific threshold value, the location where the laser beam emerges from the diode laser can be changed by varying the currents through the electrodes. In that case the read apparatus need not be provided with any mechanically moved additional optical elements, such as an oscillating mirror.

In the apparatus in accordance with the invention the read spot must be periodically moved about an average position, the amplitude of the movement being for example only 0.1 μm. For this purpose it is for example possible to use the diode laser shown in the right-hand part of FIG. 5. FIG. 6 is a bottom view of this diode laser. A current I from the d.c. source 18 is applied to the subelectrodes 15' and 15''. Between this source and the electrode 15'' a second source 24 is included which for example supplies a current I' (sin $(2\pi/T)t$). For the shape of the electrode shown in FIG. 6 the laser action will occur along the line $l_1$ at the instant $t=0$, along the line $l_2$ at the instant $t=\frac{1}{4}T$, and along the line $l_3$ at the instant $t=\frac{3}{4}T$. The amplitude ($\Delta z$) of the periodic movement is determined by the ratio I'/I. This ratio is for example 0.2.

Owing the periodic movement of the read spot transverse to the track direction, the read beam, as the record carrier rotates, is subjected to a low-frequency modulation, in addition to a high-frequency modulation, owing to the sequence of the areas and intermediate areas in the track. FIG. 7 represents said additional modulation, which is assumed to be sinusoidal. In the case of a low-frequency read-out, i.e. if the individual areas are not read out separately, a track which consists of pits behave as a groove in the record carrier which reflects the radiation partly outside the objective system. If the read spot should not oscillate in the transverse direction (r) the variation of the signal as a function of the position of the read spot may be represented by the curve 40. The position $r_0$ is the center of a certain track and the positions $r_1$ and $r_2$ are the centers of the adjacent tracks, and $r_3$ and $r_4$ are positions halfway between two tracks. In FIG. 7 the periodic movement of the read spot may be represented by the curve 41. The axes t are time axes.

If the read spot oscillates about the position $r_5$, i.e. if the average position of the read spot exhibits a deviation to the right relative to the center of a track to be read, the output signal of the diode laser is modulated with the low frequency signal 42. If the read spot oscillates about the position $r_6$, the output signal is modulated with the low-frequency signal 43. The frequency of the signals 42 and 43 equals the frequency with which the read spot oscillates. If the average position of the read spot coincides with the center of the track to be read, (the position $r_0$ in FIG. 7), the output signal of the diode laser is modulated with the signal 44 which has a small amplitude and a frequency which is twice the frequency of the signals 42 and 43.

If the output signal of the diode laser contains a component with a frequency equal to the frequency with which the read spot oscillates, this means that the read spot is not correctly positioned relative to the track to be read. By comparing the phase of the low-frequency component with the phase of the control signal by means of which the read spot is oscillated, the direction of a deviation can be determined.

The right-hand part of FIG. 5 schematically shows how signal processing is achieved. The output signal S of the diode laser is applied to a high-pass filter 25 and also to a low-pass filter 26. The low-pass filter is connected to the electronic circuit 9 which processes the signal to an information signal $S_i$. The low-pass filter is connected to a phase-sensitive circuit 27 in which the low-frequency component of the signal S is compared with a signal from the source 24 and in which a control signal $S_r$ for correcting the position of the read spot relative to the center of a track to be read is derived.

For this connection the diode laser may, for example, be driven with the aid of a coil in a magnet field, as is shown in FIG. 8. In this Figure the laser beam b is directed towards the reader. The diode laser is mounted in a holder 45 which carries a drive coil 46. The reference numeral 47 designates a permanent magnet and 48 and 49 are springs. The signal $S_r$ (see FIG. 5) is applied to the drive coil 46. As a result, the holder 45 and thus the diode laser 6 can be moved in the z-direction over a specific distance, while the springs substantially prevent a movement in the x or y-direction.

A diode laser is small and light element, so that the drive means in accordance with FIG. 8 can also be small and light. The circuit arrangement of FIG. 5 can also be very small and may be integrated with the diode laser.

The periodic movement of the read spot transverse to the track direction can also be obtained by making the diode laser itself oscillate in the z-direction. This oscillation might be obtained by applying a periodic signal to the drive coil 46 in the apparatus of FIG. 8 such that the holder 45 moves with its resonance frequency. For determining a positional error of the read spot relative to the center of a track to be read, the phase of the low-frequency component of the output signal S is then compared with the phase of the periodic movement of the read spot.

Instead of by moving the diode laser the position of the read spot may also be corrected by including an additional mirror in the radiation path between the diode laser and the objective system, in the case of a stationary diode laser, which mirror is pivotable about an axis which is effectively parallel with the direction of a track portion to be read. Such a pivotable mirror is described in "Philips Technical Review" 33, No. 7, pp. 186-189. However, from a constructional point of view the embodiment with a movable diode laser is to be preferred.

Instead of electromagnetic elements for making the read spot oscillate transversely to the track direction or for correcting the position of the read spot relative to a track to be read it is also possible to use electrostrictive elements.

A further requirement for a correct read-out of the record carrier is that the read beam b should always remain sharply focussed at the plane of the information structure. Should this not be the case, the modulation depth of the read-out high-frequency signal might decrease and crosstalk between adjacent tracks might occur. In accordance with the invention the radiation-source/detection-unit comprises opto-electronic means for deriving a signal which provides an indication of the degree of focussing, so that the focussing can be corrected with the aid of this signal.

In the same manner as the described method for detecting positional errors of the read spot relative to the center of a track to be read, the plane of focussing may be moved periodically for detecting focussing errors. The frequency, for example 50 kHz, of the movement is substantially smaller than the frequency which corresponds to the average spatial frequency, for example, $10^6 \cdot m^{-1}$, of the information on the record carrier, while the amplitude, for example 0.1 $\mu$m, of the movement is smaller than the depth of focus of the objective system.

Owing to the periodic movement of the plane of focussing, the modulation depth of the signal S which is supplied by the diode laser will vary periodically with low frequency. In the absence of the periodic variation the signal S as a function of the focussing may be represented by the curve 50 in FIG. 9. The point $F_o$ represents the situation in which on the average the read beam is sharply focussed on a track. The point $F_1$ corresponds to the situation where the beam is focussed behind the plane of the information structure and point $F_2$ to the situation where the beam is focussed in front of the plane of the information structure. The periodic variation of the focussing may be represented by the curve 51. The axes t are again time axes. The periodic variation of the focussing results in a low-frequency component in the output signal S of the diode laser, which component is represented by the curves 52, 53 and 54. $T_1$ is the period of the focussing variation. The signal component in accordance with the curve 54, which occurs if the read beam is correctly focussed has a frequency, averaged in time, that is equal to twice the frequency with which the focussing is varied. The signal components in accordance with the curves 52 and 53 have the same frequency as the focussing variation, but these components exhibit a 180° phase shift relative to each other.

By means of a phase-sensitive detection, in a similar way as described for the detection of positional errors of the read spot relative to the center of a track to be read, it can be established whether the read beam is correctly focussed on the average and in which direction a possible error occurs. For this use can then be made of an arrangement similar to that of FIG. 5. In the circuit 27 the phase of the low-frequency component of the signal S is then compared with the phase of the periodic focussing variation. At the output of the circuit 27 a signal $S_f$ is then obtained with which the focussing can be corrected.

The periodic variation in the focussing can be obtained by making the diode laser oscillate along the optical axis. For this purpose for example a magnet system, of which a cross-section is shown in FIG. 10, may be used. In FIG. 10 the laser beam emerges in the direction 19. The elements 55, 56, 57, 58 and 59 correspond to the elements 45, 46, 47, 48 and 49 of FIG. 8. The drive coil is energized with an alternating current of for example 50 kHz and with a small amplitude, such that the plane in which the read beam is focussed is moved over some tenth of $\mu$m's in the x-direction.

For correcting the average position of the plane of focussing with the aid of the signal $S_f$ the focal length of the objective system might be readjusted or the objective system might be moved with the aid of a magnet system. However, preferably the average position of the plane of focussing is adjusted by correcting the position of the diode laser along the optical axis by applying a current proportional to $S_f$ to the energizing coil 56 in an arrangement like that of FIG. 10.

Instead of electromagnetic elements it is alternatively possible to employ electrostrictive elements for periodically varying the focussing of the read beam or for correcting the average position of the plane of focussing.

When combining the described methods of detecting the position of the read spot and the position of the plane of focussing in one read unit, two low-frequency components will occur in the output signal of the diode laser. In order to enable these components to be satisfactorily distinguished from each other the frequencies with which the read spot oscillates in the plane of the tracks and perpendicularly to the plane of the tracks respectively might be selected to differ substantially in such a way that the signals do not contain any upper harmonics of each other. This would mean that the frequency of a control signal would have to be high. Moreover, two signal generators would then be needed.

In accordance with the invention, however, both oscillations may have the same frequency.

Indeed, both for determining a focussing error and for determining an error in the position of the read spot relative to the center of a track to be read, a low-frequency component in the output signal S of the diode laser is compared with a reference signal. The reference signal is defined by the movement of the diodelaser along the optical axis, or by the movement of the read spot transversely to the track direction. The low-frequency components can only be either in phase or in phase opposition with their associated reference signal. If the reference signals are now 90° phase shifted relative to each other, the low-frequency components differ sufficiently and the reference signals may have the same frequency. The reference signals may then be supplied by one signal generator, the phase of one of the reference signals being 90° shifted relative to the phase of the other reference signal.

In accordance with a further aspect of the invention it is advantageous for determining a positional error of the read spot relative to the center of a track to be read to use a principle described in the applicant's previous U.S. Pat. No. 3,876,842, issued Apr. 8, 1975. In accordance with this principle, two auxiliary beams, are projected on to the information structure in addition to the read beam, which auxiliary beams are either emitted by separate gas lasers or are derived from the read beam. The auxiliary beams, after they have been in contact with the information structure, must be directed to separate auxiliary detectors. The known apparatus has the disadvantages that a substantial amount of radiation is lost, that the radiation path is fairly intricate, and that the stability of the apparatus should comply with stringent requirements. Moreover, undesired variations in the beam from the gas laser may influence the derived control signals.

In accordance with the invention use is made of the fact that three diode lasers can readily be integrated. In that case no beams or radiation sources need be aligned relative to each other. As the laser beams which are reflected by the record carriers are again intercepted by the diode lasers, no additional detectors need be employed. The read apparatus is of very simple construction as is shown in FIG. 12.

FIG. 11 shows an example of a composite diode laser 60 which comprises three diode lasers. This diode laser comprises a common layer 62 of the n-conductivity type on which a common electrode 61 is disposed. The layer of the p-conductivity type is divided into three sections 66, 67 and 68 which via separate electrodes 69, 70 and 71 are connected to the current source 18. The active regions in which the laser-action occurs are designated 63, 64 and 65. In FIG. 11 the laser beams are directed towards the reader.

These laser beams are designated $b_1$, $b_2$ and $b_3$ in FIG. 12. The beam $b_1$ is the read beam which is focussed by the objective system 7 to form a read spot $V_1$ on the plane of the information structure. The beams $b_2$ and $b_3$ are auxiliary beams which mutually have the same intensity. This intensity may be smaller than that of the beam $b_1$. The beams $b_2$ and $b_3$ are focussed to auxiliary spots $V_2$ and $V_3$. The centers of the auxiliary spots are shifted relative to the center of the read spot in opposite directions and over a distance which for example equals a quarter of the track width in the lateral direction of the tracks. By slightly tilting the composite diode laser about the optical axis of the objective system it is achieved that the auxiliary spots are slightly shifted in opposite directions relative to the read spot in the longitudinal direction of the tracks.

FIG. 11 also shows how the output signals of the individual diode lasers can be processed. The signal from the read diode is applied to the previously mentioned circuit 9 via a high-pass filter 72 the high-frequency information signal $S_i$ being available at the output of said circuit. The output signals of the auxiliary diode lasers are applied to an electronic circuit 75 via low-pass filters 73 and 74, in which circuit the signals are compared with each other and in which a control signal $S_r$ is generated. By means of this control signal the positions of the auxiliary radiation spots are corrected, for example with an arrangement as shown in FIG. 8, in such a way that the signal $S_r$ becomes zero. The position of the read spot is then automatically also correct.

The composite diode laser with three separate lasers may also be used for detecting a focussing error. For this purpose the plane from which the laser beams emerge from the laser diode should be disposed obliquely relative to the optical axis of the objective system. FIG. 13 represents this situation. The laser sources are now disposed at different distances from the objective system, so that images $V_1$, $V_2$ and $V_3$ of the laser sources which are formed by the objective system are disposed in different planes. Care is taken that the auxiliary beams $b_2$ and $b_3$ have the same intensity, that $V_3$ lies as far in front of $V_1$ as $V_2$ lies behind $V_1$, and that $V_1$, $V_2$ and $V_3$ have the same radial positions.

If, as is shown in FIG. 13, the read beam is now exactly focussed on the plane of the tracks, the radiation intensity which is received by the read diode, will be a maximum, apart from the modulation owing to the information details. The auxiliary beams $b_2$ and $b_3$ are then out of focus and the auxiliary diodes receive a lower radiation intensity which, however, is the same for the two auxiliary diodes. If the plane of the tracks is shifted to the right, the intensity in the returning beam $b_2$ is greater than that in the returning beam $b_3$. If the plane of the tracks is shifted to the left, the intensity of the returning beam $b_3$ is greater than that in the returning beam $b_2$. By comparing the low-frequency components in the output signals of the auxiliary diodes the magnitude and the direction of a focussing error can be detected. This can be effected with an arrangement similar to that of FIG. 11. The circuit 75 then supplies a control signal $S_f$ for correcting the focussing.

As previously stated it is an advantage of feedback read-out that the optical read unit is of very simple construction, this unit essentially comprising only one radiation-source/detection-unit and an objective system. By employing the methods of deriving the control signal described hereinbefore, no additional optical element need be added to the read unit. The entire optical read unit may then solely consist of a small tube having a length of for example 60 mm and a diameter of for example 20 mm. This tube is then capable of supplying both the high frequency information signal and the control signals.

For reading one track of a round disk-shaped record carrier the carrier is rotated about its center. For sequentially reading all the tracks the tube can be moved in a radial direction relative to the record carrier. For this purpose a holder in which the tube is movably disposed, may be connected to a carriage drive as described in "Philips Technical Review", 33, No. 7, pages 178–180. Fine adjustment of the position of the read spot relative to a track to be read and adjustement of the focussing of the read beam respectively can then be obtained by moving the tube in its holder in a direction which is transverse to the longitudinal direction and in the longitudinal direction, respectively, focussing then being possible with an accuracy down to for example 0.5 μm and positioning being possible with an accuracy down to 0.1 μm. For this purpose the tube might be externally provided with electromechanical drive means. FIG. 16 shows a cross-section through the tube in accordance with the invention.

For moving the tube in its longitudinal direction the tube may be disposed in a magnet system similar to that of FIG. 10, the tube 100 then being disposed at the location of the diode laser 6 in FIG. 16. To the coil 56 the signal $S_f$ is applied. The movement of the tube in the transverse direction can be obtained with the aid of a magnet system similar to that of FIG. 8, the tube 100 being then disposed at the location of the diode laser 6 and the signal $S_r$ being applied to the coil 46.

In analogy with what has been previously proposed in U.S. Ser. No. 787,610, filed Apr. 14, 1977, the position of the read spot relative to a track to be read can also be corrected by pivoting the tube about an axis. FIGS. 14 and 15 show a drive means for realizing the pivotal movement and the axial movement of the tube.

In FIG. 14 the tubular optical read unit is again designated by the reference numeral 100. A permanent magnetic circuit comprises an axially magnetized permanent magnet 80 with a central opening 81 and two soft iron end plates 82 and 83 at the two axial ends. A hollow soft-iron core 84 is disposed in the central opening 81. A cylindrical coil construction 85 which is coaxially arranged around the soft iron core 84 is secured to the tube 100 which construction is axially movable in the annular air gap 86 between the end plate 82 and the core 84 and a second annular air gap 87 between the end plate 83 and the core 84. The bearing means for focussing is a plain bearing for the parallel guidance of he tube 100 and comprises a first bearing bush 88 which is connected to the frame and a second bearing bush 89 which is connected to the objective and which is axially movable relative to the bearing bush 88. The bearing bush 88 is rigidly connected to the core 84 with the aid of two bearing pins 90. These bearing pins are rigidly mounted inthe core 84, while two bearing bushes 91, which are rigidly secured in the bearing bush 88, are pivotable on the pins. In the present embodiment the bearing bush 89, as previously stated, is rigidly connected to the tube 100 and is movable in the bearing bush 88. Obviously, it is also possible to use the outer wall of the tube 100 itself as a part of te plain-bearing arrangement.

The major advantage of the construction in accordance with FIG. 14 is that the tube 100 is movable in the direction of its optical axis 92 and, for correcting the position of the read spot relative to the center of a track to be read, about the pivoting axis 93 with the aid of a single electromagnetic system only, the permanent magnet 80 performing a double function. The coil construction 85 is provided with two coils 94 which are symmetrically arranged at either side of the pivoting axis 93, also see FIG. 15, which coils serve both for focussing and for positioning the read spot. With the aid of a mounting plate 95, see FIG. 14, on which the cylindrical soft-iron core 84 is mounted, a construction is realized in which between each of the end plates 82 and 83 and the core 84 an annular air gap is formed, namely the air gaps 86 and 87. Thus, a high efficiency of the electro-magnetic means for axially moving and pivoting the tube 100 can be obtained. A part 96 of the turns of each coil 94, see FIG. 15, extends in the air gap 86 and another part 97 in the air gap 87. These parts 96 and 97 are situated so as to provide an equally directed contribution to an electrically generated torque about the pivoting axis 93.

The electromagnetic forces which are exerted on the parts 96 and 97 of the coils 94 are directed axially. Focussing movements can be performed if the current directions through the corresponding parts 96 and 97 of the two coils are selected so that the axial forces have the same direction and are of equal magnitude. In the case of a deviation therefrom a pivotally movement of the tube 100 is obtained which may be used for positioning the read spot relative to a track to be read.

When reading a record carrier on which a television program is stored it may furthermore be necessary to correct the position of the read spot in a tangential direction, i.e. in the longitudinal direction of a track to be read. As previously described in the U.S. Pat. No. 3,876,827, issued Apr. 18, 1975, a deviation in the tangential position of the read spot can be detected with the aid of the same auxiliary spots $V_2$ and $V_3$ (see FIG. 12) which are used for detecting an error in the radial position of the read spot. The phase of the control signals supplied by the auxiliary diode lasers should then be shifted by an amount equal to a quarter of the revolution period of the round record carrier. For correcting the tangential position of the read spot it is again possible to employ electromagnetic means. The complete device in accordance with FIG. 14 may then, for example, be incorporated in a further magnetic system which can move this device in the longitudinal direction of a track to be read.

Instead of electromagnetic means it is alternatively possible to utilize electrostrictive means for realizing, the axial, the radial and the tangential movement of the tube relative to the record carrier.

In FIG. 16 the tube in which the optical read unit is accommodated is designated 100. The diode laser and the associated circuits are integrated in the element 101. The diode laser is supplied via the supply line 102. The high-frequency information signal $S_i$ and the control signals $S_f$, $S_r$ and $S_t$ (tangential) are available at the lines 103, 104, 105 and 109. For detecting a focussing error the diode laser may comprise three separate laser sources as described with reference to FIG. 13. For detecting the position of the read spot relative to a track to be read, for example, the laser source, which supplies the read beam has the shape shown in FIGS. 5 and 6. Other combinations of the methods described for the detection of a focussing error and of the position of the read spot are of course possible.

The radiating area, for example 2.5 μm by 0.5 μm, of the diode laser, must be imaged on the information structure. Whereas in a read apparatus with a gas laser the radiation source is disposed at a comparatively great distance from the objective system, the distance between the diode laser and the objective system in the optical read unit in accordance with the invention is small. Therefore, the objective system should comply with more stringent requirements in respect of the magnitude of the object field. The wave length ($\lambda$ is for example 890 mm) of the radiation produced by a diode laser is substantially greater than that of the radiation supplied by a helium neon laser (λ=633 mm), so that the numerical aperture of the objective system in the optical read unit in accordance with the invention should be substantially greater (for example 0.63) than that of an objective system used in a read apparatus with a helium neon laser (N.A. is then for example 0.45). The image of the diode laser formed by the objective system must be plane to a high degree.

In order to meet these requirements an objective system with a comparatively large number of lens elements might be selected. However, in accordance with the invention the number of lens elements of the objective system may be limited to two, while this objective system can be manufactured in a comparatively simple manner. As can be seen from FIG. 16, this objective system consists of two single lenses 106 and 108. The system is hemisymmetrical, which means that the parameters of the lenses 106 and 108 may be derived from each other if the desired magnification factor A of the system is given. The lenses 106 and 108 each have two aspherical surfaces. Such lenses, also called bi-aspherical lenses, are described in the U.S. Pat. No. 4,027,952, issued June 7, 1977.

If the dimensions of the radiating surface of the diode laser are not greater than the desired dimensions of the read spot, the lenses 106 and 108 need only form an 1-to-1 image. Then identical lenses may be used and the lens system is symmetrical, so that it will not exhibit asymmetry errors such as coma and astigmatism. The fact that the laser beam between the lenses 106 and 108 is a collimated beam, see FIG. 16, is advantageous in view of manufacturing tolerances.

A problem which may arise when using a diode laser is that the laser radiation is astigmatic. This astigmatism may be the result of imperfections during manufacture of the diode layers or of the waveguide character of the diode laser. Instead of radiation with a spherical wavefront, radiation with a toroidal wavefront is then emitted. This astigmatism may be reduced with the aid of a correction lens 107 to the extent that it is no longer noticeable. The lens 107 may be a cylindrical lens, the direction of the cylinder axis being determined by the astigmatism of the diode laser. The lens 107 may alternatively be a so-called "zero-lens". Such a lens which is described in the optical literature has a paraxial strength of 0. The radii of curvature of the lens faces have been selected so that the lens as a whole exhibits no refractive action. By tilting this lens through a specific angle, so that the optical axis of the lens makes a specific angle with the optical axis of the system formed by the lenses 106 and 108, the lens will exhibit a certain astigmatism. The zero lens will be employed in particular when it is anticipated that the astigmatism of the diode lasers will exhibit a certain spread. The main point of the spread can be determined experimentally and the corresponding tilting angle of the zero lens can be calculated, so that in the case of mass production of the optical read unit an average tilting angle of the zero lens may be used or only a slightly correction of the tilting angle if necessary.

What is claimed is:

1. An optical read unit for reading information from a record carrier having a radiation reflective information structure composed of a plurality of generally parallel tracks in which the information is stored in optically detectable form, said optical read unit comprising a semiconductor diode laser having two opposed, reflective end faces defining a resonant laser cavity therebetween, said diode laser producing a read beam of radiation for scanning said tracks upon relative movement between said read unit and said record carrier, means for focussing said read beam to a spot on the information structure so as to modulate said read beam in dependence on the stored information, said focussing means including a hemisymmetrical objective system having a first and second simple lens with aspherical surface, means for periodically changing the position at which said beam is focussed to said spot relative to the track to be read so as to produce corresponding, periodic modulation of said read beam, said focussing means being arranged to direct the modulated radiation reflected by said information structure back to said diode laser so as to produce changes in a detectable property of said diode laser in dependence on the modulation of said reflected radiation, and means responsive to said property changes for deriving therefrom an information signal representative of the stored information and a further signal representative of deviations of the position at which said spot is focussed from a desired position.

2. An optical read unit as claimed in claim 1, wherein the first and the second lens are identical to each other and the first lens is a collimating lens.

3. An optical read unit as claimed in claim 1 including a correction lens disposed between the first and the second lens for compensating for the astigmatism of the radiation emitted by the diode lasers.

4. An optical read unit as claimed in claim 3, wherein the correction lens is a zero lens whose optical axis makes an angle adapted to the astigmatism of the diode lasers with the optical axis of the system formed by the first and the second lens.

5. The read unit according to claim 1 including a housing, said laser diode and said focussing means being mounted in said housing so that said read beam is directed towards said record carrier, means for supporting said housing for movement in a direction parallel to the axis of said read beam and in a direction perpendicular thereto and electrochemical means for moving said hosing so as to correct the position of said spot in response to said further signal.

6. An optical read unit for reading information from a record carrier having a radiation reflective information structure comprised of a plurality of generally parallel tracks in which the information is stored in optically detectable form, said optical read unit comprising a semiconductor diode laser having two opposed, reflective end faces defining a resonant laser cavity therebetween, said diode laser producing a read beam of radiation for scanning said tracks upon relative movement between said read unit and said record carrier, means for focussing said read beam to a spot on the information structure so as to modulate said read beam in dependence on the stored information, means for periodically changing the location on said laser from which said radiation beam is emitted so as to produce oscillatory movement of said spot transversely to the direction of the track to be read so as to produce corresponding, periodic modulation of said read beam, said focussing means being arranged to direct the modulated radiation reflected by said information structure back to said diode laser so as to produce changes in a detectable property of said diode laser in dependence on the modulation of said reflected radiation, and means responsive to said property changes for deriving therefrom an information signal representative of the stored information and a further signal representative of deviation of the position at which said spot is focussed from a desired position.

7. The read unit according to claim 6 wherein said location changing means includes a plurality of electrodes on said diode laser and means for applying a periodically varying electrical signal to said electrodes.

8. The read unit according to claims 6 or 7 wherein said further signal is representative of deviation of the position of said spot relative to the center of the track to be read and means responsive to said further signal for correcting the position of said spot.

9. An optical read unit for reading information from a record carrier having a radiation reflective information structure comprised of a plurality of generally parallel tracks in which the information is stored in optically detectable form, said optical read unit comprising a semiconductor diode laser having two opposed, reflective end faces defining a resonant layer cavity therebetween, said diode laser producing a read beam of radiation for scanning said tracks upon relative movement between said read unit and said record carrier, means for focussing said read beam to a spot on the information structure so as to modulate said read beam in dependence on the stored information, means for periodically moving said diode laser transversely to the direction of the track to be read so as to produce oscillatory movement of said spot transversely of the track direction and a corresponding, periodic modulation of said read beam, said focussing means being arranged to direct the modulated radiation reflected by said information structure back to said diode laser so as to produce changes in a detectable property of said diode laser in dependence on the modulation of said reflected radiation, and means responsive to said property changes for deriving therefrom an information signal representative of the stored information and a further signal representative of deviations of the position at which said spot is focussed from a desired position.

10. An optical read unit for reading information from a record carrier having a radiation reflective information structure comprised of a plurality of generally parallel tracks in which the information is stored in optically detectable form, said optical read unit comprising a semiconductor diode laser having two opposed, reflective end faces defining a resonant laser cavity therebetween, said diode laser producing a read beam of radiation for scanning said tracks upon relative movement between said read unit and said record carrier, means for focussing said read beam to a spot on the information structure so as to modulate said read beam in dependence on the stored information, first means for periodically moving said read beam in a direction transverse of the tracks, second means for periodically moving said diode laser in a direction parallel to the axis of said read beam, the periodic movement produced by one of said first and second means being represented by a function $p(f \cdot t)$ and the periodic movement produced by the other of said first and second means being represented by a function $p(nf \cdot t + \pi/2)$, where p is a periodic function, t is time, f is the frequency of said periodic movement which is substantially lower than the average frequency of said information signal, and n is an integer, so as to produce corresponding, periodic modulation of said read beam, said focussing means being arranged to direct the modulated radiation reflected by said information structure back to said diode laser so as to produce changes in a detectable property of said diode laser in dependence on the modulation of said reflected radiation, and means responsive to said property changes for deriving therefrom an information signal representative of the stored information and a further signal, said further signal including a first error signal indicative of the displacement of said spot relative to the center of the track to be read and a second error signal indicative of the displacement of the plane of focusing of said focussing means from the desired position.

11. The read head according to claim 10 including a housing, said laser diode and said focussing means being mounted in said housing so that said read beam is directed towards said record carrier, means for supporting said housing for movement in a direction parallel to the axis of said read beam and in a direction perpendicular thereto and electromechanical means for correcting the position of said housing in response to said further signal.

12. An optical read unit for reading information from a record carrier having a radiation reflective information structure comprised of a plurality of generally parallel tracks in which the information is stored in optically detectable form, said optical read unit comprising a first semiconductor diode laser having two opposed, reflective end faces defining a resonant laser cavity therebetween, said first diode laser producing a read beam of radiation for scanning said tracks upon relative movement between said read unit and said record carrier, a pair of auxiliary diode lasers for producing a pair of auxiliary beams of equal intensity, means for focussing said read beam and said auxiliary beams to a read spot and a pair of auxiliary spots, respectively, on the information structure, said diode lasers and said focussing means being arranged such that the positions at which said auxiliary beams are focussed to said auxiliary spots are spaced in opposite directions relative to the center of said read spot so that upon said relative movement said read beam is modulated in dependence on the information stored in the tracks and said auxiliary beams are modulated in dependence on the displacement of the position at which said read spot is focussed from a desired position on the track to be read, said focussing means being arranged to direct the modulated radiation of said beams which is reflected by the information structure back to the respective one of said laser diodes so as to produce changes in a detectable property of the respective laser diode in dependence on the modulation of the reflected radiation, first means associated with said first laser diode for deriving, from said property changes thereof, an information signal representative of the stored information, and second means associated with said auxiliary diode lasers for deriving, from the property changes thereof, a further signal representative of said displacement.

13. The read unit according to claim 12 wherein said positions at which said auxiliary spots are formed are spaced from the center of said read spot in the lateral direction of the track to be read, and wherein said further signal is representative of the deviation between the center of said read spot and the center of a track to be read.

14. The read unit according to claim 12 wherein said positions at which said auxiliary beams are focussed are spaced in a direction parallel to the axis of said read beam from the position at which said read beam is focussed, and wherein said further signal is representative of the deviation of the plane of focussing of said focussing means from the desired position.

15. The read head according to claims 12, 13 or 14 including a housing, said laser diodes and said focussing means being mounted in said housing so that said beams are directed towards said record carrier, means for supporting said housing for movement in a direction parallel to the axis of said read beam and in a direction perpendicular thereto and electromechanical means for correcting the position of said housing in response to said further signal.

16. The read unit according to claim 12 wherein said focussing means includes a hemisymmetrical objective system having a first and second simple lens with aspherical surfaces.

17. An optical read unit as claimed in claim 16, wherein the first and the second lens are identical to each other and the first lens is a collimating lens.

18. An optical read unit as claimed in claim 16 including a correction lens disposed between the first and the second lens for compensating for the astigmatism of the radiation emitted by the diode lasers.

19. An optical read unit as claimed in claim 18, wherein the correction lens is a zero lens whose optical axis makes an angle adapted to the astigmatism of the diode lasers with the optical axis of the system formed by the first and the second lens.

20. An optical read unit for reading information from a record carrier having a radiation reflective information structure comprised of a pluralty of generally parallel tracks in which the information is stored in optically detectable form, said optical read unit comprising a semiconductor diode laser having two opposed, reflective end faces defining a resonant laser cavity therebetween, said diode laser producing a read beam of radiation for scanning said tracks upon relative movement between said read unit and said record carrier, means for focussing said read beam to a spot on the information structure so as to modulate said read beam in dependence on the stored information, means for periodically moving said read beam in a direction generally normal to the beam axis and transverse of the direction of the track to be read with an amplitude smaller than the diameter of said spot and with a frequency substantially lower than the frequency corresponding to the average spatial frequency of the details in the information structure so as to produce corresponding, periodic modulation of said read beam, said focussing means being arranged to direct the modulated radiation reflected by said information structure back to said diode laser so as to produce changes in a detachable property of said diode laser in dependence on the modulation of said reflected radiation, means responsive to said property changes for deriving therefrom an information signal representative of the stored information and a further signal comprising a corresponding, low frequency positional error signal indicative of the displacement of said read spot from the center of said track to be read, means for separating said positional error signal from said information signal, and means responsive to said positional error signal for correcting the position of said read spot relative to said track to be read.

21. An optical read unit for reading information from a record carrier having a radiation reflective information structure comprised of a plurality of generally parallel tracks in which the information is stored in optically detectable form, said optical read unit comprising a semiconductor diode laser having two opposed, reflective end faces defining a resonant laser cavity therebetween, said diode laser producing a read beam of radiation for scanning said tracks upon relative movement between said read unit and said record carrier, means for focussing said read beam to a spot on the information structure so as to modulate said read beam in dependence on the stored information, means for periodically moving said diode laser in a direction parallel to the axis of said read beam with a frequency substantially lower than the frequency corresponding to the average spatial frequency of the details in the information structure and with an amplitude smaller than the depth of focus of said focussing means to thereby periodically change the plane of focus of said spot so as to produce corresponding, periodic modulation of said read beam, said focussing means being arranged to direct the modulated radiation reflected by said information structure back to said diode laser so as to produce changes in a detectable property of said diode laser in dependence on the modulation of said reflected radiation, means responsive to said property changes for deriving therefrom an information signal representative of the stored information and a low frequency focus error signal representative of the displacement of the plane of focussing of said focussing means from a desired position, means for separating said focus error signal from said informaion signal and means responsive to said focus error signal for correcting the position of said diode laser along said axis.

22. An optical unit for use with a record carrier having a plurality of optically detectable, generally parallel tracks, said optical unit comprising a semiconductor laser for producing a beam of radiation for scanning said tracks upon relative movement between said unit and said record carrier, means for focussing said beam to a spot on the record carrier, said focussing means including a hemisymmetrical objective system having a first and second simple lens with aspherical surfaces, means for movably supporting said focussing means so as to change the position at which said beam is focussed relative to a track being scanned, means for detecting the position of said spot relative to said track being scanned and means responsive to said detecting means for moving said supporting means so that spot is positioned on said track being scanned.

* * * * *